United States Patent
Daniels et al.

(10) Patent No.: US 10,662,074 B2
(45) Date of Patent: May 26, 2020

(54) TEMPLATE-ASSISTED SYNTHESIS OF 2D NANOSHEETS USING NANOPARTICLE TEMPLATES

(71) Applicant: Nanoco Technologies Ltd., Manchester (GB)

(72) Inventors: Steven Daniels, Glossop (GB); Nigel L. Pickett, Manchester (GB)

(73) Assignee: Nanoco Technologies Ltd., Manchester (GB)

( * ) Notice: Subject to any disclaimer, the term of this patent is extended or adjusted under 35 U.S.C. 154(b) by 93 days.

(21) Appl. No.: 15/842,468

(22) Filed: Dec. 14, 2017

(65) Prior Publication Data

US 2018/0186653 A1 Jul. 5, 2018

Related U.S. Application Data

(60) Provisional application No. 62/440,745, filed on Dec. 30, 2016.

(51) Int. Cl.
*C01G 39/06* (2006.01)
*H01L 29/24* (2006.01)
(Continued)

(52) U.S. Cl.
CPC ............ *C01G 39/06* (2013.01); *B01J 27/02* (2013.01); *B01J 27/047* (2013.01); *B01J 27/051* (2013.01); *B01J 27/0573* (2013.01); *B01J 35/0013* (2013.01); *C01B 19/007* (2013.01); *C01G 9/02* (2013.01); *C01G 39/00* (2013.01); *C01G 41/00* (2013.01); *C30B 7/14* (2013.01); *C30B 19/12* (2013.01); *C30B 29/16* (2013.01); *C30B 29/46* (2013.01); *C30B 29/60* (2013.01); *H01L 21/02403* (2013.01); *H01L 21/02428* (2013.01); *H01L 21/02568* (2013.01);
(Continued)

(58) Field of Classification Search
CPC ... B01J 23/06; B01J 23/28; B01J 23/30; B01J 23/047; B01J 27/051; B01J 27/0573; B01J 35/0013
See application file for complete search history.

(56) References Cited

U.S. PATENT DOCUMENTS

2014/0220238 A1* 8/2014 Abbel .................... H05K 1/092
427/122
2016/0196893 A1 7/2016 Chen et al.
(Continued)

FOREIGN PATENT DOCUMENTS

CN 104649324 A 5/2015
CN 105148947 A 12/2015
(Continued)

OTHER PUBLICATIONS

Machine translation CN104338547 (Year: 2016).*
(Continued)

*Primary Examiner* — Alexandre F Ferre
(74) *Attorney, Agent, or Firm* — Blank Rome, LLP

(57) ABSTRACT

A template-assisted method for the synthesis of 2D nanosheets comprises growing a 2D material on the surface of a nanoparticle substrate that acts as a template for nanosheet growth. The 2D nanosheets may then be released from the template surface, e.g. via chemical intercalation and exfoliation, purified, and the templates may be reused.

18 Claims, 11 Drawing Sheets

(51) Int. Cl.
| | |
|---|---|
| H01L 29/15 | (2006.01) |
| H01L 21/02 | (2006.01) |
| C30B 19/12 | (2006.01) |
| C01G 9/02 | (2006.01) |
| C01G 41/00 | (2006.01) |
| C01G 39/00 | (2006.01) |
| C01B 19/00 | (2006.01) |
| C30B 29/16 | (2006.01) |
| C30B 29/60 | (2006.01) |
| C30B 29/46 | (2006.01) |
| B01J 27/047 | (2006.01) |
| B01J 27/057 | (2006.01) |
| B01J 27/02 | (2006.01) |
| C30B 7/14 | (2006.01) |
| B01J 35/00 | (2006.01) |
| B01J 27/051 | (2006.01) |
| B01J 23/30 | (2006.01) |
| B01J 23/28 | (2006.01) |
| B01J 23/06 | (2006.01) |

(52) U.S. Cl.
CPC ...... *H01L 21/02628* (2013.01); *H01L 29/151* (2013.01); *H01L 29/24* (2013.01); *B01J 23/06* (2013.01); *B01J 23/28* (2013.01); *B01J 23/30* (2013.01); *C01P 2002/84* (2013.01); *C01P 2004/01* (2013.01); *C01P 2004/04* (2013.01); *C01P 2004/24* (2013.01); *C01P 2004/64* (2013.01); *H01L 21/024* (2013.01); *H01L 21/0237* (2013.01); *H01L 21/02417* (2013.01); *H01L 21/02521* (2013.01); *H01L 21/02527* (2013.01); *H01L 21/02535* (2013.01); *H01L 21/02565* (2013.01)

(56) References Cited

U.S. PATENT DOCUMENTS

2016/0340533 A1  11/2016  Casiraghi et al.
2018/0127873 A1  5/2018  Sarnet et al.

FOREIGN PATENT DOCUMENTS

| CN | 105004755 B | 2/2016 |
| CN | 104893708 B | 3/2016 |
| CN | 105624643 A | 6/2016 |
| CN | 104338547 B | 8/2016 |
| WO | 2015/031461 A1 | 3/2015 |
| WO | 2016/192001 A1 | 12/2016 |

OTHER PUBLICATIONS

Zelenski, Catherine M. et al., Template Synthesis of Near-Monodisperse Microscale Nanofthers and Nanotubules of MoS2, J. AM. Chem. Soc. 1998, 120, 734-742, published on Web Jan. 13, 1998.

Int'l Search Report based on copending PCT Application No. PCT/IB2017/058021 dated Apr. 16, 2018, 20 pages.

Xi Ling, et al., "Parallel Stitching of 2D Materials," Advanced Materials, vol. 28, No. 12, Jan. 27, 2016, pp. 2322-2329.

Dong Ick Son, et al., "Emissive ZnO-graphene quantum dots for white-light-emitting diodes," Nature Nanotechnology, vol. 7, No. 7, May 27, 2012, pp. 465-471.

Yongfen Chen, et al., "Side Reactions in Controlling the Quality, Yield, and Stability of High Quality Colloidal Nanocrystals," Journal of the American Chemical Society, vol. 127, No. 38, Sep. 1, 2005, pp. 13331-13337.

Taiwanese Search Report received in copending Taiwanese Application No. 106146131 dated Aug. 3, 2018, 5 pages with translation.

* cited by examiner

TEMPLATE-ASSISTED SYNTHESIS OF 2D NANOSHEETS USING NANOPARTICLE TEMPLATES

CROSS-REFERENCE TO RELATED APPLICATIONS

This application claims the benefit of U.S. Provisional Application Ser. No. 62/440,745, filed Dec. 30, 2016, the contents of which are hereby incorporated by reference in their entirety.

STATEMENT REGARDING FEDERALLY SPONSORED RESEARCH OR DEVELOPMENT

Not Applicable

BACKGROUND OF THE INVENTION

1. Field of the Invention

The present invention generally relates to nanoparticles. More particularly, it relates to the synthesis of two-dimensional (2D) layered materials (or "nanosheets") using templates.

2. Description of the Related Art Including Information Disclosed Under 37 CFR 1.97 and 1.98

The isolation of graphene via the mechanical exfoliation of graphite [K. S. Novoselov, A. K. Geim, S. V. Morozov, D. Jiang, Y. Zhang, S. V. Dubnos, I. V. Grigorieva and A. A. Firsov, *Science,* 2004, 306, 666] has sparked strong interest in two-dimensional (2D) layered materials. The properties of graphene include exceptional strength, and high electrical and thermal conductivity, while being lightweight, flexible and transparent. This opens up the possibility of a wide array of potential applications, including high speed transistors and sensors, barrier materials, solar cells, batteries, and composites.

Other classes of 2D materials of interest include transition metal dichalcogenide (TMDC) materials, hexagonal boron nitride (h-BN), as well as those based on Group 14 elements, such as silicene and germanene. The properties of these materials can range from semi-metallic, for example, $NiTe_2$ and $VSe_2$, to semiconducting, for example, $WSe_2$ and $MoS_2$, to insulating, for example, h-BN.

2D nanosheets of TMDC materials are of increasing interest for applications ranging from catalysis to sensing, energy storage and optoelectronic devices.

TMDC monolayers are atomically thin semiconductors of the type $MX_2$, where M a transition metal atom (Mo, W, etc.) and X a chalcogen atom (S, Se, or Te). A single layer of M atoms is sandwiched between two layers of X atoms. A $MoS_2$ monolayer is 6.5 Å thick. Of the 2D TMDCs, the semiconductors $WSe_2$ and $MoS_2$ are of particular interest because, while largely preserving their bulk properties, additional properties arise due to quantum confinement effects when the dimensions of the materials are reduced to mono- or few layers. In the case of $WSe_2$ and $MoS_2$, these include the exhibition of an indirect-to-direct band gap transition, with strong excitonic effects, when the thickness is reduced to a single monolayer. This leads to a strong enhancement in photoluminescence efficiency, opening up new opportunities for the application of such materials in optoelectronic devices. Other materials of interest include $WS_2$ and $MoSe_2$.

The discovery of graphene illustrates how new physical properties may emerge when a bulk crystal of macroscopic dimensions is thinned down to one atomic layer. Like graphite, TMDC bulk crystals are formed of monolayers bound to each other by van der Waals attraction. TMDC monolayers have properties that are distinctly different from those of the semi-metal graphene. For example, TMDC monolayers $MoS_2$, $WS_2$, $MoSe_2$, $WSe_2$, $MoTe_2$ have a direct band gap, and can be used in electronics as transistors and in optics as emitters and detectors. Group 4 to 7 TMDCs predominantly crystallise in layered structures, leading to anisotropy in their electrical, chemical, mechanical and thermal properties. Each layer comprises a hexagonally packed layer of metal atoms sandwiched between two layers of chalcogen atoms via covalent bonds. Neighbouring layers are weakly bound by van der Waals interactions, which may easily be broken by mechanical or chemical methods to create mono- and few-layer structures.

The TMDC monolayer crystal structure has no inversion center, which allows access to a new degree of freedom of charge carriers, namely the k-valley index, and to open up a new field of physics: "valleytronics."

The strong spin-orbit coupling in TMDC monolayers leads to a spin-orbit splitting of hundreds meV in the valence band and a few meV in the conduction band, which allows control of the electron spin by tuning the excitation laser photon energy.

The work on TMDC monolayers is an emerging research and development field since the discovery of the direct bandgap and the potential applications in electronics and valley physics. TMDCs may be combined with other 2D materials like graphene and hexagonal boron nitride to make van der Waals heterostructure devices.

A semiconductor can absorb photons with energy larger than or equal to its bandgap. This means that light with a shorter wavelength is absorbed. Semiconductors are typically efficient emitters if the minimum of the conduction band energy is at the same position in k-space as the maximum of the valence band, i.e., the band gap is direct. The band gap of bulk TMDC material down to a thickness of two monolayers is still indirect, so the emission efficiency is lower compared to monolayered materials. The emission efficiency is about $10^4$ times greater for a TMDC monolayer than for bulk material. The band gaps of TMDC monolayers are in the visible range (between 400 nm and 700 nm). The direct emission shows two transitions called A and B, separated by the spin-orbit coupling energy. The lowest energy and therefore most important in intensity is the A emission. Owing to their direct band gap, TMDC monolayers are promising materials for optoelectronics applications.

In its multilayer form, $MoS_2$ is a silvery black solid that occurs as the mineral molybdenite—the principal ore for molybdenum. $MoS_2$ is relatively unreactive. It is unaffected by dilute acids and oxygen. $MoS_2$ is similar to graphite in its appearance and feel. It is widely used as a solid lubricant due to its low-friction properties and robustness. As a TMDC, $MoS_2$ possesses some of graphene's desirable qualities (such as mechanical strength and electrical conductivity), and can emit light, opening possible applications such as photodetectors and transistors.

For high-performance applications, flat, defect-free material is required, whereas for applications in batteries and supercapacitors, defects, voids and cavities are desirable.

Mono- and few-layer 2D nanosheets may be produced using "top-down" and "bottom-up" approaches. Top-down approaches involve the removal of layers, either mechanically or chemically, from the bulk material. Such techniques include mechanical exfoliation, ultrasound-assisted liquid phase exfoliation (LPE), and intercalation techniques. Bottom-up approaches, wherein 2D layers are grown from their constituent elements, include chemical vapor deposition (CVD), atomic layer deposition (ALD), and molecular beam epitaxy (MBE), as well as solution-based approaches including hot-injection.

A number of approaches to synthesize 2D nanosheets have been described in the prior art, the most common of which include mechanical exfoliation, LPE and CVD, with a small number of reports of solution-based approaches predominantly utilizing hot-injection techniques. While mechanical exfoliation provides highly crystalline flakes, the process is low yielding, offers poor thickness control and is unscalable. LPE offers a scalable route to the production of 2D nanosheets, and may be carried out under ambient conditions using less hazardous chemicals than other techniques. However, as with mechanical exfoliation, it provides poor thickness control, along with low reaction yields, and produces small flakes. Poor reaction yields are also typical of CVD syntheses. Advantages of this method include large area scalability, uniformity and thickness control. However, the quality of the resulting material is not comparable to that of mechanically exfoliated flakes, with the so-produced flakes typically being small and displaying poor long-term stability. Solution-based synthetic approaches are of increasing interest and have the potential to provide control over the size, shape and uniformity of the resulting 2D materials. Yet, further improvements are required to provide the ultimate combination of a scalable method of synthesis that generates flakes with the desired crystallographic phase, a tunable and narrow size and shape distribution, and capped with a volatile ligand.

The growth of single-layer graphene on ZnO to form quasi-core/shell nanoparticles has been described by Son et al. [D. I. Son, B. W. Kwon, D. H. Park, W.-S. Seo, Y. Yi, B. Angadi, C.-L. Lee and W. K. Choi, *Nat. Nanotechnol.*, 2012, 7, 465]. However, there was no discussion on the isolation of graphene nanosheets from the ZnO surface.

$MoS_2$ is an example of a material that transitions from indirect to direct band gap when a multilayer form is converted to monolayers. The synthesis of individual discrete monolayers is difficult especially when the size of the monolayer also needs to be controlled since this also influences the band gap. Recently QDs have been formed that may be split into monolayers thus providing some control. However this method produces sheets with different sizes. Moreover, without all the QDs being the same size, the dispersity becomes even greater. To obtain the individual monolayer sheets involves a 2 step process, first QD formation, and then monolayer intercalation to provide individual sheets.

Thus, there is a need for a scalable method of synthesis of 2D nanosheets that provides a high degree of control over the size, shape and uniformity of the material.

BRIEF SUMMARY OF THE INVENTION

Herein, a template-assisted method of synthesis of 2D nanosheets is described wherein 2D nanosheets are grown on the surface of a substrate that acts as a template for nanosheet growth. The 2D nanosheets may then be released from the template surface, for example via chemical intercalation and exfoliation, and the templates may be reused.

In one embodiment, a method for preparing a 2D nanosheet comprises providing a nanoparticle template, growing a 2D nanosheet on a surface of the nanoparticle template, removing the 2D nanosheet from the surface of the nanoparticle template, and separating the 2D nanosheet from the nanoparticle template.

In one embodiment, the nanoparticle template comprises a material having a first crystal structure and the 2D nanosheet comprises a material having a second crystal structure, wherein the lattice mismatch between the first crystal structure and the second crystal structure is around 5% or lower, for example, around 3% or lower.

In one embodiment, the nanoparticle template has a hexagonal crystal structure.

In one embodiment, the nanoparticle template may be a semiconductor nanoparticle, a metal nanoparticle, a metal oxide nanoparticle or a polymer nanoparticle. In one embodiment, the nanoparticle template is a quantum dot. In a further embodiment, the nanoparticle template is a nanopyramid.

In one embodiment, the 2D nanosheet is a 2D nanoflake. In a further embodiment, the 2D nanosheet is a 2D quantum dot.

In one embodiment, the 2D nanosheet is a transition metal dichalcogenide nanosheet.

In one embodiment, the 2D nanosheet may be removed from the surface of the nanoparticle template via intercalation and exfoliation, or via ultrasonication.

The 2D nanosheet may be separated from the nanoparticle template via a size-selective separation technique, such as solvent polarity purification.

In one embodiment, a transition metal dichalcogenide nanosheet is grown on a ZnO nanoparticle template.

BRIEF DESCRIPTION OF THE SEVERAL VIEWS OF THE DRAWING(S)

Figure 11:
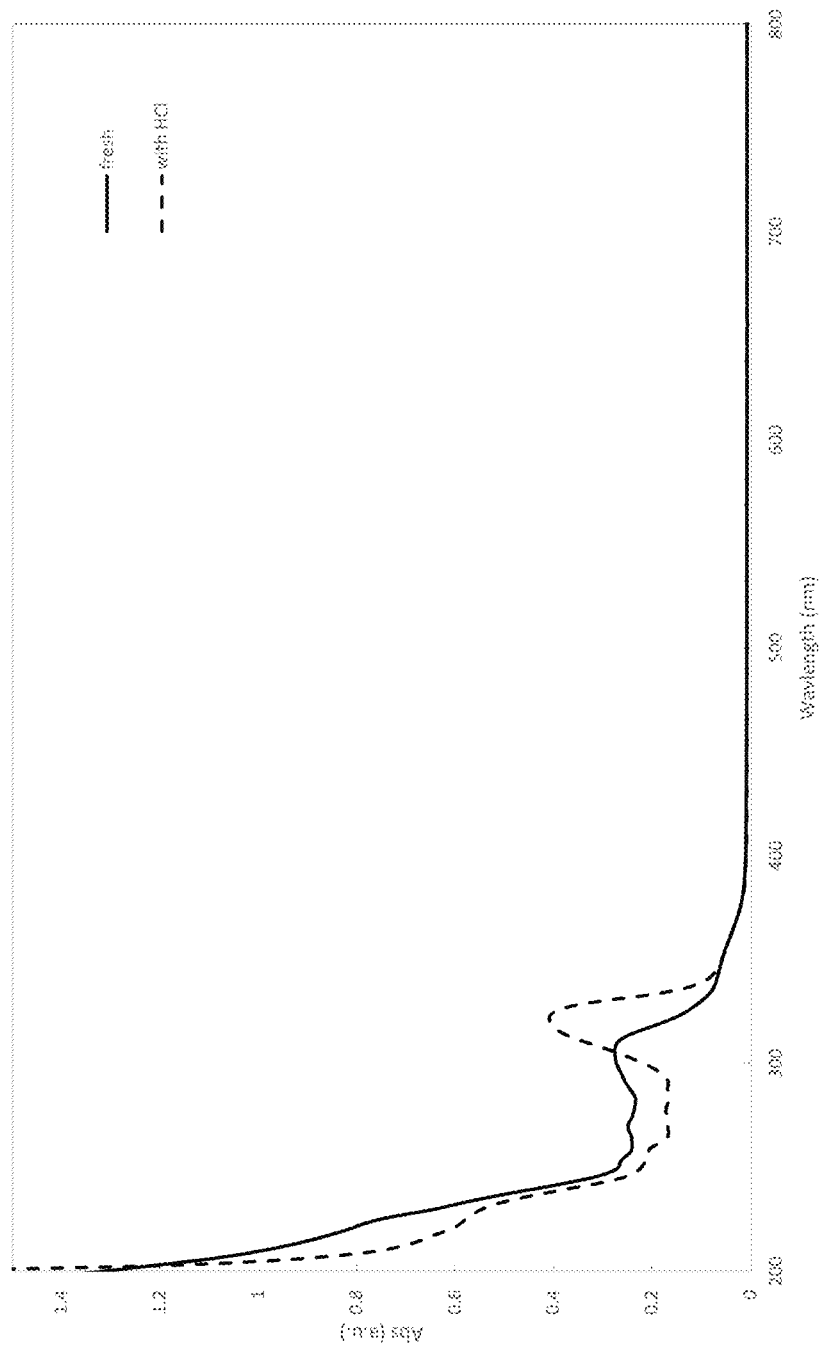

FIG. 11 presents a comparison of the UV-vis absorption spectra of fresh (as-extracted) and acidified nanosheets.

DETAILED DESCRIPTION OF THE INVENTION

Figure 1:
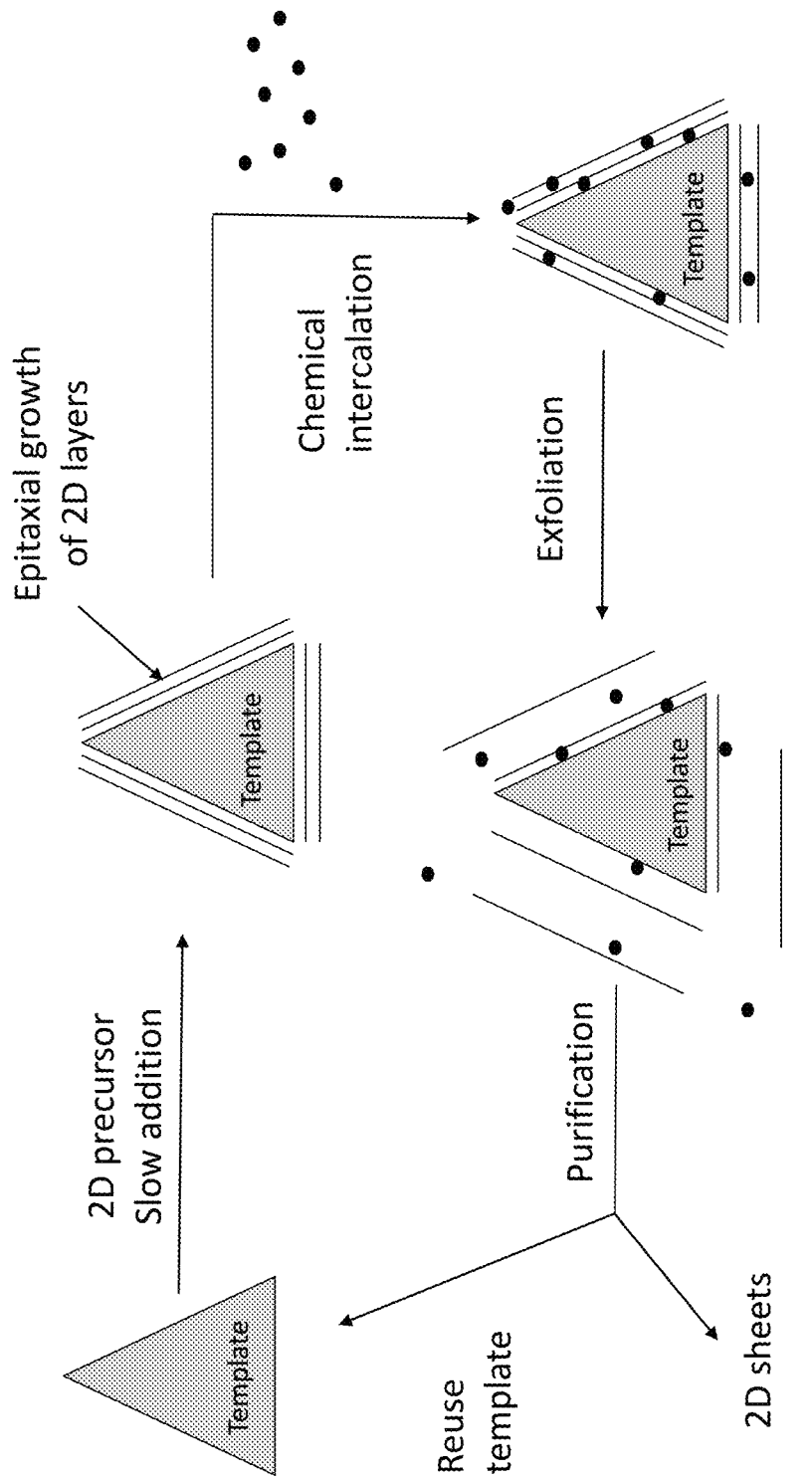
FIG. 1 is a schematic diagram illustrating a process of template-assisted growth of 2D nanosheets according to one embodiment.

Herein, a template-assisted method of synthesis of 2D nanosheets is described wherein 2D nanosheets are grown on the surface of a substrate that acts as a template for nanosheet growth. The 2D nanosheets may then be released from the template surface, for example via chemical intercalation and exfoliation, and the templates may be reused. A process of template-assisted growth of 2D nanosheets according to certain embodiments is illustrated in FIG. 1.

As used herein, the term "2D nanosheet" is used to describe a particle having a thickness between 1 to 10 atomic or molecular monolayers, and wherein the lateral dimensions are greater than the thickness. The term "nanoparticle" is used to describe a particle with dimensions on the order of approximately 1 to 100 nm. The term "quantum dot" (QD) is used to describe a semiconductor nanoparticle displaying quantum confinement effects. The dimensions of QDs are typically, but not exclusively, between 1 to 20 nm. The terms "nanoparticle" and "quantum dot" are not intended to imply any restrictions on the shape of the particle. The term "2D nanoparticle" is used to describe a particle with lateral dimensions on the order of approximately 1 to 100 nm and a thickness between 1 to 10 atomic or molecular layers, and wherein the lateral dimensions are greater than the thickness. The term "2D nanoflake" is used to describe a particle with lateral dimensions on the order of approximately 1 to 100 nm and a thickness between 1 to 5 atomic or molecular monolayers.

The shape and composition of the nanoparticle template are unrestricted. In one embodiment, the nanoparticle template comprises a semiconductor nanoparticle. In another embodiment, the nanoparticle template comprises a metal oxide nanoparticle. In another embodiment, the nanoparticle template comprises a metal nanoparticle. In another embodiment, the nanoparticle template comprises a polymer nanoparticle. In a particular embodiment, the nanoparticle template comprises a QD.

Suitable template materials may include:
semiconductor materials, such as, but not restricted to:
Group 12-16 (II-VI) semiconductor materials, for example, ZnO, ZnS, ZnSe, ZnTe, CdS, CdSe, CdTe, HgS, HgSe, and HgTe;
Group 13-15 (III-V) semiconductor materials, for example, BP, AlP, AlAs, AlSb, GaN, GaP, GaAs, GaSb, InN, InP, InAs, InSb, AlN, and BN;
Group 13-14 (III-IV) semiconductor materials, for example, $B_4C$, $Al_4C_3$, and $Ga_4C$;
Group 13-16 (III-VI) semiconductor materials, for example, $Al_2S_3$, $Al_2Se_3$, $Al_2Te_3$, $Ga_2S_3$, $Ga_2Se_3$, $In_2S_3$, $In_2Se_3$, $Ga_2Te_3$, and $In_2Te_3$; and
Group 14-16 (IV-VI) semiconductor materials, for example, SnS, $SnS_2$, SnSe, SnTe, PbS, PbSe, and PbTe;
I-III-VI semiconductor materials, for example, $CuInS_2$, $CuInSe_2$, $CuGaS_2$, $CuGaSe_2$, $AgInS_2$, and $AgInSe_2$;
and including doped derivatives and alloys thereof;
metal nanoparticles, for example, Cu, Au, Ag, and Pt;
oxide nanoparticles, for example, $TiO_2$, $SiO_2$, and $ZrO_2$; and
polymer nanoparticles, for example polytetrafluoroethylene (PTFE).

Where an ALD coating is applied to the surface of the nanoparticles, the surface coating may be an inorganic material (e.g. $Al_2O_3$), an organic material (e.g. polyethylene glycol), or an inorganic-organic hybrid material (e.g. an aluminium alkoxide "alucone" polymer).

In one embodiment, the nanosheet material to be made comprises a 2D layered material. Suitable examples include, but are not restricted to:
graphene;
graphene oxide, and reduced graphene oxide;
transition metal dichalcogenides, for example, $WO_2$, $WS_2$, $WSe_2$, $WTe_2$, $MnO_2$, $MoO_2$, $MoS_2$, $MoSe_2$, $MoTe_2$, $NiO_2$, $NiTe_2$, $NiSe_2$, $VO_2$, $VS_2$, $VSe_2$, $TaS_2$, $TaSe_2$, $RuO_2$, $RhTe_2$, $PdTe_2$, $HfS_2$, $NbS_2$, $NbSe_2$, $NbTe_2$, $FeS_2$, $TiO_2$, $TiS_2$, $TiSe_2$, and $ZrS_2$;
transition metal trichalcogenides such as, for example, $TaO_3$, $MnO_3$, $WO_3$, $ZrS_3$, $ZrSe_3$, $HfS_3$, and $HfSe_3$;
Group 13-16 (III-VI) compounds such as, for example, InS, InSe, GaS, GaSe, and GaTe;
Group 15-16 (IV-VI) compounds such as, for example, $Bi_2Se_3$, and $Bi_2Te_3$;
nitrides, for example, h-BN;
oxides, for example, $LaVO_3$, $LaMnO_3$, $TiO_2$, $MnO_2$, $V_2O_5$, $TaO_3$, $RuO_2$, $MnO_3$, $WO_3$, $LaNbO_7$, $Ca_2Nb_3O_{10}$, $Ni(OH)_2$, and $Eu(OH)_2$;
layered copper oxides; micas; and bismuth strontium calcium copper oxide (BSCCO);
phosphides, for example, $Li_7MnP_4$, and $MnP_4$;
silicene; germanene; and stanene.

Within these materials, adjacent layers are held together by van der Waals interactions, which may readily be broken by techniques such as intercalation and exfoliation to remove the nanosheets from the template surface.

A particular embodiment includes a method of synthesizing a 2D TMDC nanosheet on a nanoparticle template. In one embodiment, the nanoparticle template material has a hexagonal crystal structure and a low lattice mismatch to the nanosheet material so as to enable uniform monolayer growth of a nanosheet shell to proceed. Otherwise, excessive strain may give rise to defects or even entirely separate particle growth.

In the case of $MoS_2$, the lattice mismatch to hexagonal ZnO is about 3%. By controlling conditions carefully, monodisperse, wide band gap, ZnO nanoparticle core templates may be made and a monolayer of $MoS_2$ epitaxially grown thereon providing luminescence due to the $MoS_2$. By controlling the ZnO nanoparticle core size, the outer $MoS_2$ size (and hence band gap) may consequently be controlled, thus providing a range of photoluminescence- (PL-) emitting core/shell structures. The as-formed nanosheets may be removed from the ZnO nanoparticle surface, leaving the ZnO nanoparticle templates to be reused.

For the growth of $MoS_2$, it is believed that curvature in the crystal lattice may lead to an indirect band gap. Therefore, in one embodiment, the 2D nanosheets are grown on nanopyramid-shaped nanoparticles, providing a flat surface for nanosheet growth. The growth of ZnO nanopyramids has previously been described by Chen et al. [Y. Chen, M. Kim, G. Lian, M. Johnson and X. Peng, *J. Am. Chem. Soc.*, 2005, 127, 13331]

Other 2D shell materials may be used in place of $MoS_2$. Particular materials of interest are those with monolayer luminescence such as $MoSe_2$, $WS_2$ and $WSe_2$. Other core structures or alloys may be chosen that have a similar crystal structure and low lattice mismatch such as GaN to $MoS_2$.

However, the shape of the template is not restricted to nanopyramids. In other embodiments, 2D nanosheets are grown on a template with a curved surface. Examples of suitable templates include spherical nanoparticles of semiconductor materials, or spherical nanoparticles of polymers such as polytetrafluoroethylene (PTFE). The use of a spherical template may assist in the lifting and removal of the as-formed nanosheet from the surface of the template.

In a further embodiment, 2D nanosheets are grown on the surface of a template wherein the template comprises a layer of material deposited by atomic layer deposition (ALD). ALD provides highly conformal coatings, therefore a template with an ALD-coated surface may provide a highly uniform substrate for 2D nanosheet growth, leading to the synthesis of highly uniform, defect-free nanosheets.

In one embodiment, the nanoparticle template comprises a material having a first crystal structure and the nanosheet comprises a material having a second crystal structure, wherein the first crystal structure and the second crystal structure have a small lattice mismatch. In one embodiment the lattice mismatch between the first crystal structure and the second crystal structure is around 5% or lower, for example, around 3% or lower. A small lattice mismatch may be desirable as this may help to facilitate epitaxial growth of the nanosheet on a surface of the template, and to prevent strain at the interface between the template and the 2D nanosheet.

In one embodiment, the 2D nanosheets are 2D nanoflakes. In one embodiment, the 2D nanosheets are 2D QDs. QDs have widely been investigated for their unique optical, electronic and chemical properties, which originate from "quantum confinement effects"; as the dimensions of a semiconductor nanoparticle are reduced below twice the Bohr radius, the energy levels become quantized, giving rise to discrete energy levels. The band gap increases with decreasing particle size, leading to size-tunable optical, electronic and chemical properties, such as size-dependent photoluminescence. Moreover, it has been found that reducing the lateral dimensions of a 2D nanoflake into the quantum confinement regime may give rise to yet further unique properties, depending on both the lateral dimensions and the number of layers of the 2D nanoflake. In one embodiment, the lateral dimensions of the 2D nanoflakes may be in the quantum confinement regime, wherein the optical, electronic and chemical properties of the nanoflakes may be manipulated by changing their lateral dimensions. For example, metal chalcogenide monolayer nanoflakes of materials such as $MoSe_2$ and $WSe_2$ with lateral dimensions of approximately 10 nm or less may display properties such as size-tunable emission when excited. This can enable the electroluminescence maximum ($EL_{max}$) or photoluminescence ($PL_{max}$) of the 2D nanoflakes to be tuned by manipulating the lateral dimensions of the nanoflakes. As used herein, a "2D quantum dot" or "2D QD" refers to a semiconductor nanoparticle with lateral dimensions in the quantum confinement regime and a thickness between 1-5 atomic or molecular monolayers. As used herein, a "single-layered quantum dot" or "single-layered QD" refers to a semiconductor nanoparticle with lateral dimensions in the quantum confinement regime and a thickness of a single monolayer. Compared with conventional QDs, 2D QDs have a much higher surface area-to-volume ratio, which increases as the number of monolayers is decreased. The highest surface area-to-volume ratio is seen for single-layered QDs. This may lead to 2D QDs having very different surface chemistry from conventional QDs, which may be exploited for applications such as catalysis.

By changing the dimensions of the template, the lateral dimensions of the nanosheet grown on the surface may be modified, thus allowing control over the emission wavelength of the nanosheets.

The method of preparing the nanoparticle templates is unrestricted. The method of preparing the nanosheets on the template surface is unrestricted. In one embodiment, one or more nanosheet precursors are added to a solution of the templates under conditions to effect the conversion of the one or more nanosheet precursors to nanosheets on a surface of the templates. The as-formed nanosheets may subsequently be removed from the template surface and separated from the templates.

The as-formed nanosheets may be removed from the template surface by any suitable technique. In one embodiment, the nanosheets are removed from the template surface by an intercalation and exfoliation process. Intercalation and exfoliation processes are well-known in the art and are described in Applicant's co-pending U.S. patent application Ser. No. 15/631,323, filed Jun. 23, 2017, which is hereby incorporated by reference in its entirety. An intercalation and exfoliation process typically involves the addition of an intercalating agent to a layered material to expand the inter-layer distance, followed by an exfoliation process to prize the layers apart. In one embodiment, the intercalation process comprises stirring the substrate-bound (template-nanosheet) material in the presence of one or more primary amines, for example, hexylamine and/or propylamine. In a further embodiment, the exfoliation process comprises stirring the intercalated substrate-bound (template-nanosheet) material in a solvent such as, but not restricted to, acetonitrile. In another embodiment, the nanosheets are removed from the template surface via ultrasonication.

The nanosheets may be subsequently purified to separate them from the templates. Optionally, size-selective separation techniques may be used to isolate nanosheets having similar dimensions (and thus similar emissive properties). Non-limiting examples of size-selective separation techniques include: solvent polarity purification; size-selective precipitation; column chromatography; and dialysis.

Surprisingly, it has been found that a post-treatment comprising an acidification step may increase the photoluminescence quantum yield (PLQY) of the nanosheets.

Applications of nanosheets may include, but are not restricted to: photoluminescence applications; electroluminescence applications; photovoltaic applications; catalysis; sensors; heterostructure devices; and use in devices such as field-effect transistors and photodetectors. The nanosheets may also be surface-functionalized for use in biological applications, such as biological imaging.

Example 1: Template-Assisted Growth of $MoS_2$ Nanosheets on ZnO Templates

ZnO Template Synthesis 16 g octadecane and 0.506 g (0.8 mmol) zinc stearate were mixed and degassed at 105° C. for 1 hr. 4 g octadecane and 1.082 g (4 mmol) octadecanol were mixed in a vial and degassed for 1 hr at 100° C. In another vial 2 g octadecane and 0.2275 g (0.8 mmol) steric acid were mixed and degassed at 100° C. for 1 hr. Under nitrogen, the zinc stearate/octadecane mixture was heated to 280° C. The octadecanol/octadecane mixture was loaded into a syringe and quickly injected. The solution was left for 8 minutes. The steric acid/octadecane mixture was loaded into a syringe and injected after 8 minutes. The reaction was left for a further 2 hrs and then cooled to 80° C. 100 mL ethylacetate were added and the reaction centrifuged. 10 mL toluene were added and warmed to dissolve the solid. 20 mL methanol were added and the flocculate was collected by centrifugation. The solid was re-dissolved in toluene with warming and passed through a 0.2 µm Teflon syringe filter.

Figure 2:
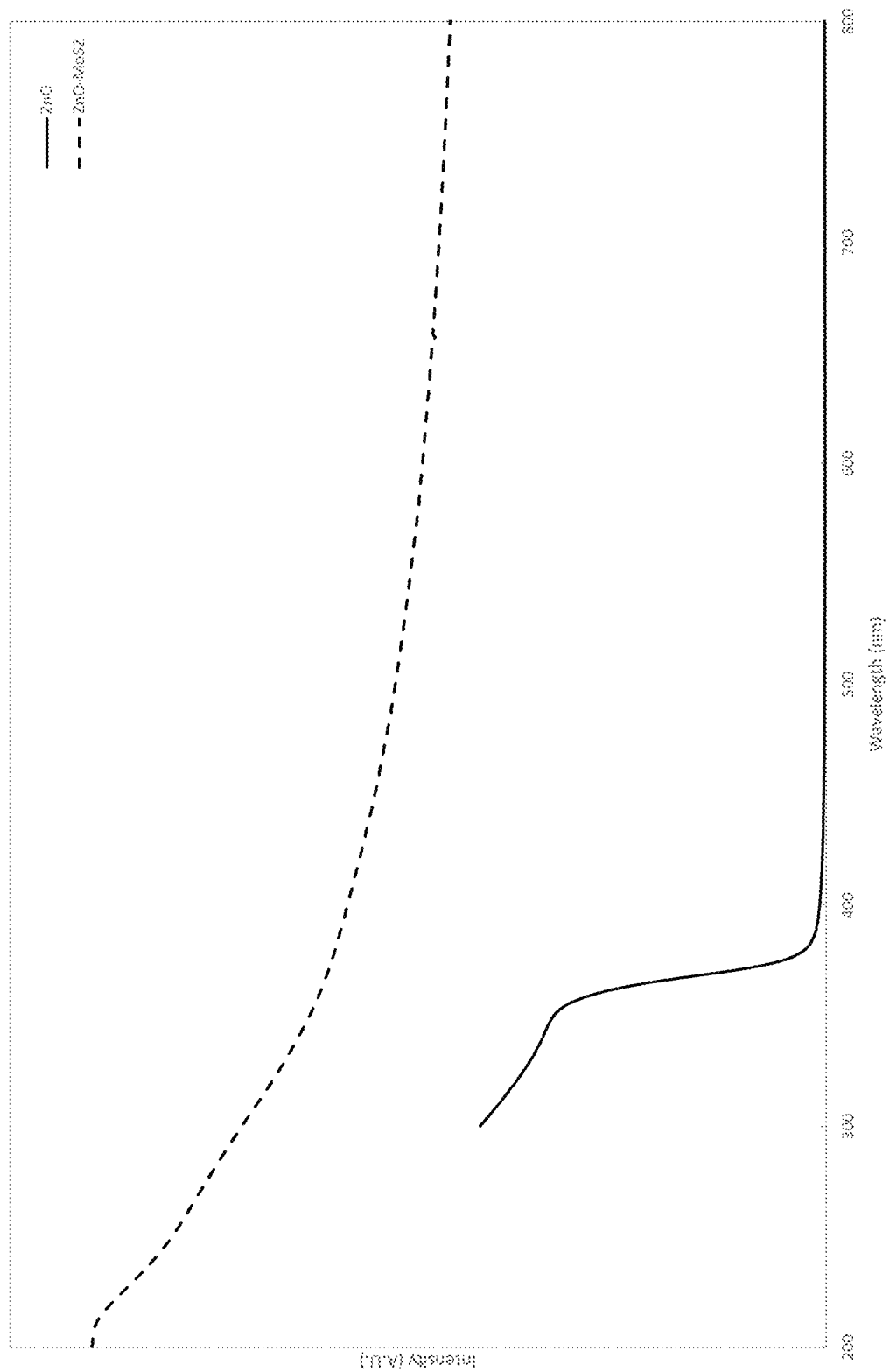
FIG. 2 is a UV-vis absorption spectrum of ZnO nanoparticle templates (solid line) and of the substrate-bound $MoS_2$ material of Example 1 (dashed line).
Figure 3:
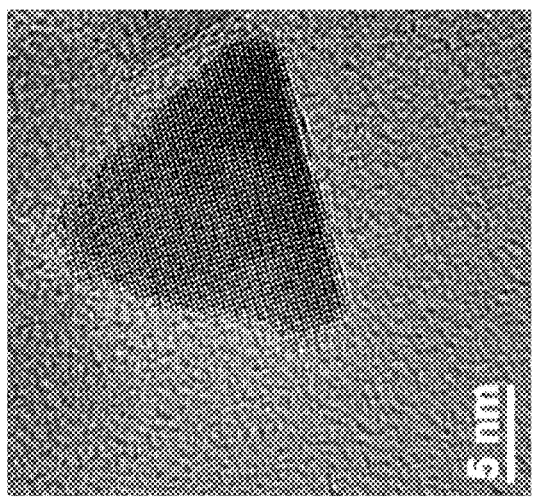
FIG. 3 is a high-resolution transmission electron micrograph of ZnO templates.

The UV-visible (UV-vis) absorption spectrum of the ZnO nanoparticle templates is shown in FIG. 2 (solid line). High-resolution transmission electron microscopy (FIG. 3) shows triangular-shaped nanoparticles suggestive of nanopyramids.

Ligand Exchange 1 g hexadecylamine, 10 mL hexadecane and all of the ZnO cores were added to a freshly cleaned round-bottomed flask and degassed at 100° C. for 1 hr. The reaction was left at 110° C. overnight to enable ligand exchange. The next day the reaction was degassed a further 1 hr at 100° C.

Substrate-Bound $MoS_2$ Synthesis

In a vial, 2 g hexadecylamine and 10 mL hexadecane were mixed and degassed at 100° C. for 1 hr. In a glovebox, a vial was loaded with 0.132 g $Mo(CO)_6$ then capped with a SUBA-SEAL® rubber septum [SIGMA-ALDRICH CO., LLC, 3050 Spruce Street St. Louis Mich. 63103] and removed from the glovebox. The hexadecylamine/hexadecane mixture was loaded into a syringe and transferred to the $Mo(CO)_6$ vial. The $Mo(CO)_6$/hexadecylamine/hexadecane mixture was warmed to about 150° C. under nitrogen until a clear, dark yellow/orange solution formed. The ligand-exchanged ZnO cores were heated to 250° C. and 0.5 mL portions of the molybdenum precursor were added every 5 minutes until 5 mL in total were added. Then, 0.75 mL dodecanethiol was added over 40 minutes and left for 1.5 hrs when complete. Three lots of 2 mL portions of the molybdenum precursor were then added at 5 minute intervals to complete the molybdenum addition. 0.75 mL dodecanthiol was then added over 5 minutes and left for 45 minutes. The reaction was cooled to 60° C., then 80 mL acetone were added and centrifuged. The solid was redissolved in 25 mL hexane and stored under $N_2$.

Figure 4:
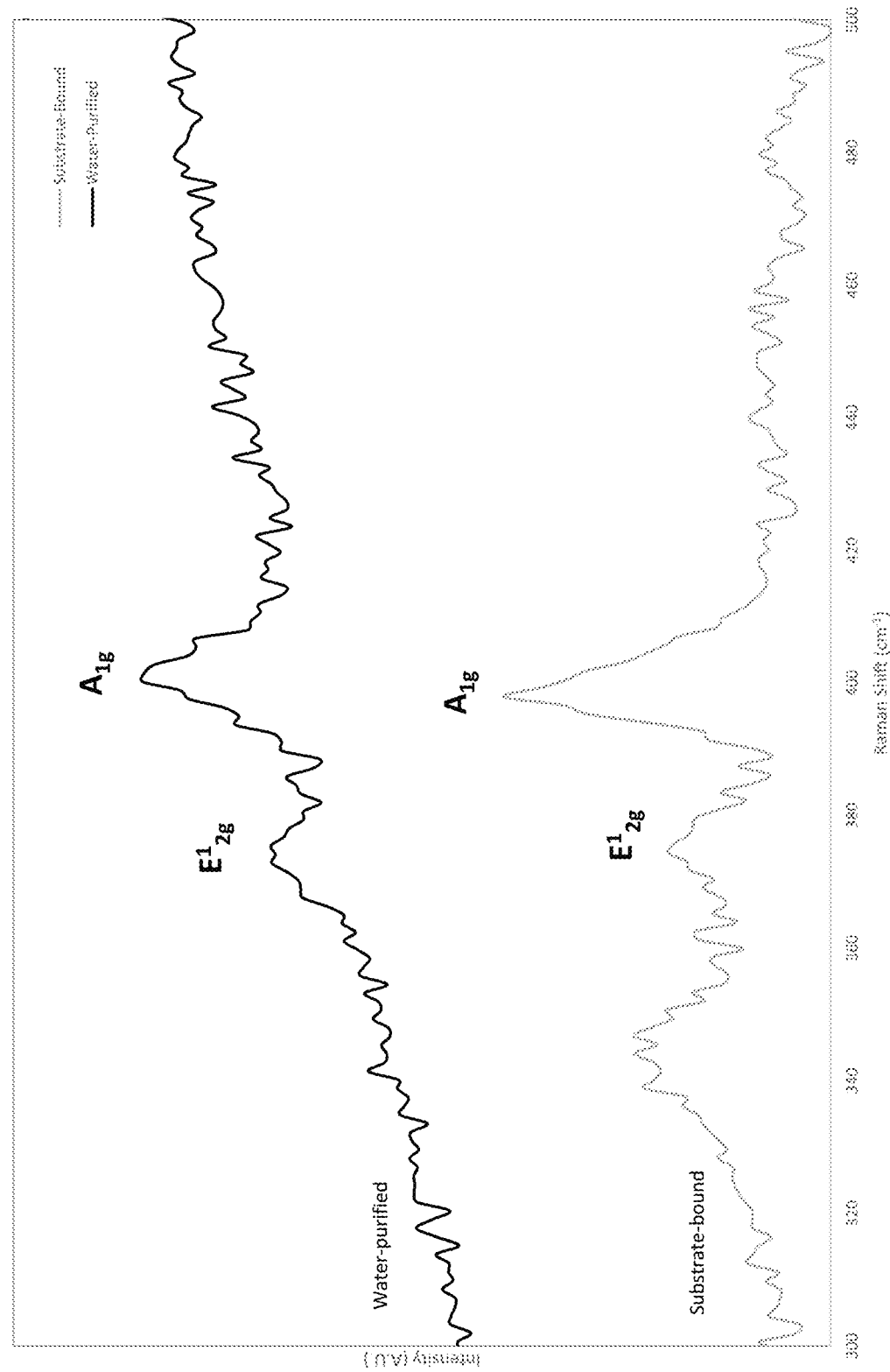
FIG. 4 is a Raman spectrum of the substrate-bound $MoS_2$ material of Example 1 (grey line) and of the water-purified $MoS_2$ material prepared in Example 1 (solid line).
Figure 5:
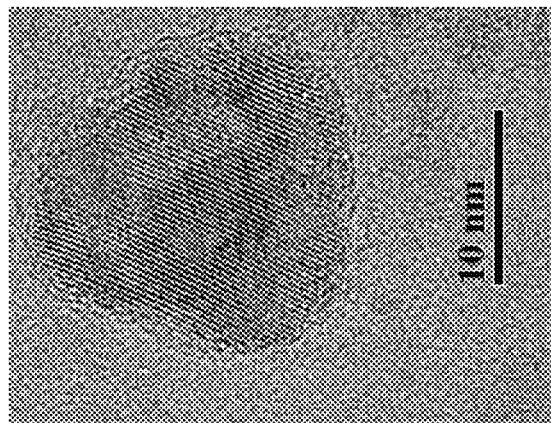
FIG. 5 is a high-resolution transmission electron micrograph of the substrate-bound $MoS_2$ nanosheets prepared in Example 1.

The UV-vis absorption spectrum of the substrate-bound $MoS_2$ material is shown in FIG. 2 (dashed line). The change in the UV-vis absorption spectrum compared to that of the ZnO templates is indicative of nanosheet growth on the template. FIG. 4 (grey line) shows the Raman spectrum of the substrate-bound $MoS_2$ material. The peaks at ~375 and 398 $cm^{-1}$ are in good accordance with the literature values for the $E^1_{2g}$ and $A_{1g}$ bands of $MoS_2$, respectively. High-resolution TEM (FIG. 5) shows the substrate-bound $MoS_2$. The obscuring of the shape of the ZnO nanopyramids is indicative of nanosheet growth on the ZnO templates.

Intercalation and Exfoliation

The substrate-bound $MoS_2$ sample was added to an $N_2$-filled round-bottomed flask and to it was added 2 mL hexylamine and 10 mL propylamine, which was then stirred for 3 days. The mixture was dried using an $N_2$ flow and to the solid under $N_2$ was added 200 mL acetonitrile and stirred for 3 days. The supernatant was decanted and centrifuged and any solid discarded. The liquid was reduced to an oil, under reduced pressure at 30° C., on a rotary evaporator and then re-dissolved in 6 mL acetonitrile. The crude, exfoliated material was left in a vial, in air with the lid closed, for 6 days.

Figure 6:
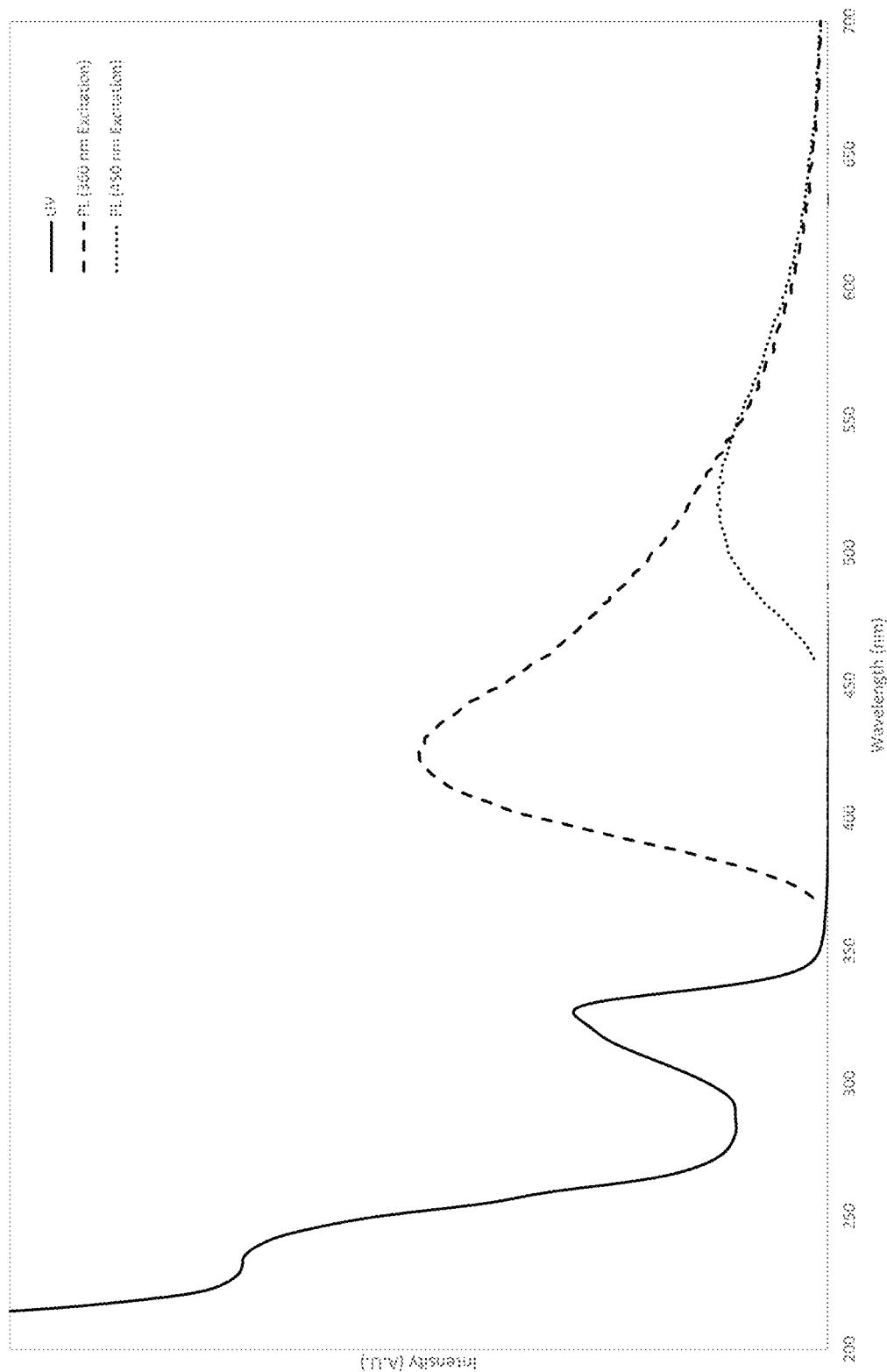
FIG. 6 is a UV-vis absorption spectrum and a photoluminescence (PL) spectrum of the crude exfoliated material of Example 1.

The UV-vis absorption spectrum of the crude exfoliated material is shown in FIG. 6 (solid line). The PL spectrum of the crude exfoliated material (at two different excitation wavelengths: 360 nm and 450 nm) is also shown in FIG. 6 (dashed and dotted lines, respectively), revealing excitation wavelength-dependent PL.

Solvent Polarity Purification

The sample was dried back to an oil on a rotary evaporator and then 30 mL water were added. The sample was sonicated briefly and then passed through a 0.45 µm polypropylene syringe filter. The water sample was flushed with $N_2$ and stored in a glass vial. Residual solid retained on the filter and in the rotary evaporator flask was collected with acetonitrile and again passed through the same syringe filter. Residual solid that was not water- or acetonitrile-soluble was collected by the addition of toluene.

Figure 7:
FIG. 7 is UV-vis absorption (solid line) and PL (dashed line) spectra of the fraction of material extracted in Example 1 in water (bottom), acetonitrile (middle) and toluene (top).
Figure 8:
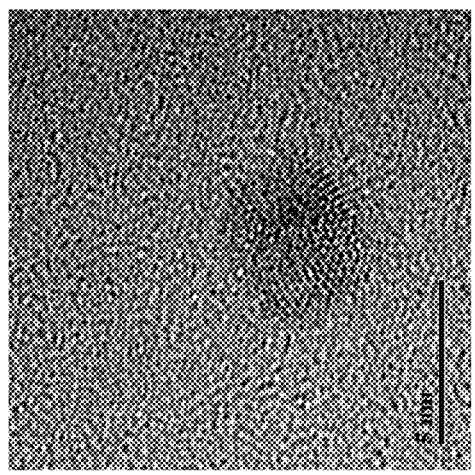
FIG. 8 is a transmission electron micrograph of the water-purified $MoS_2$ material prepared in Example 1.

The fraction of material extracted in water had a PLQY of 15.5%. The UV-vis and PL spectra of the fraction of material extracted in water are shown in FIG. 7 (bottom) as the solid and dashed lines, respectively. The Raman spectrum is shown in FIG. 4 (black line). The positions of the $E^1_{2g}$ and $A_{1g}$ bands are relatively unchanged relative to those of the substrate-bound $MoS_2$. A TEM image of the water-extracted nanosheets is shown in FIG. 8, which shows round (diameter ~5 nm) nanosheets.

The fraction of material extracted in acetonitrile (MeCN) had a PLQY of 3.7%. The UV-vis and PL spectra of the fraction of material extracted in acetonitrile are shown in FIG. 7 (middle) as the solid and dashed lines, respectively.

The fraction of material extracted in toluene had a PLQY of 2.1%. The UV-vis and PL spectra of the fraction of material extracted in toluene are shown in FIG. 7 (top) as the solid and dashed lines, respectively.

Figure 9:
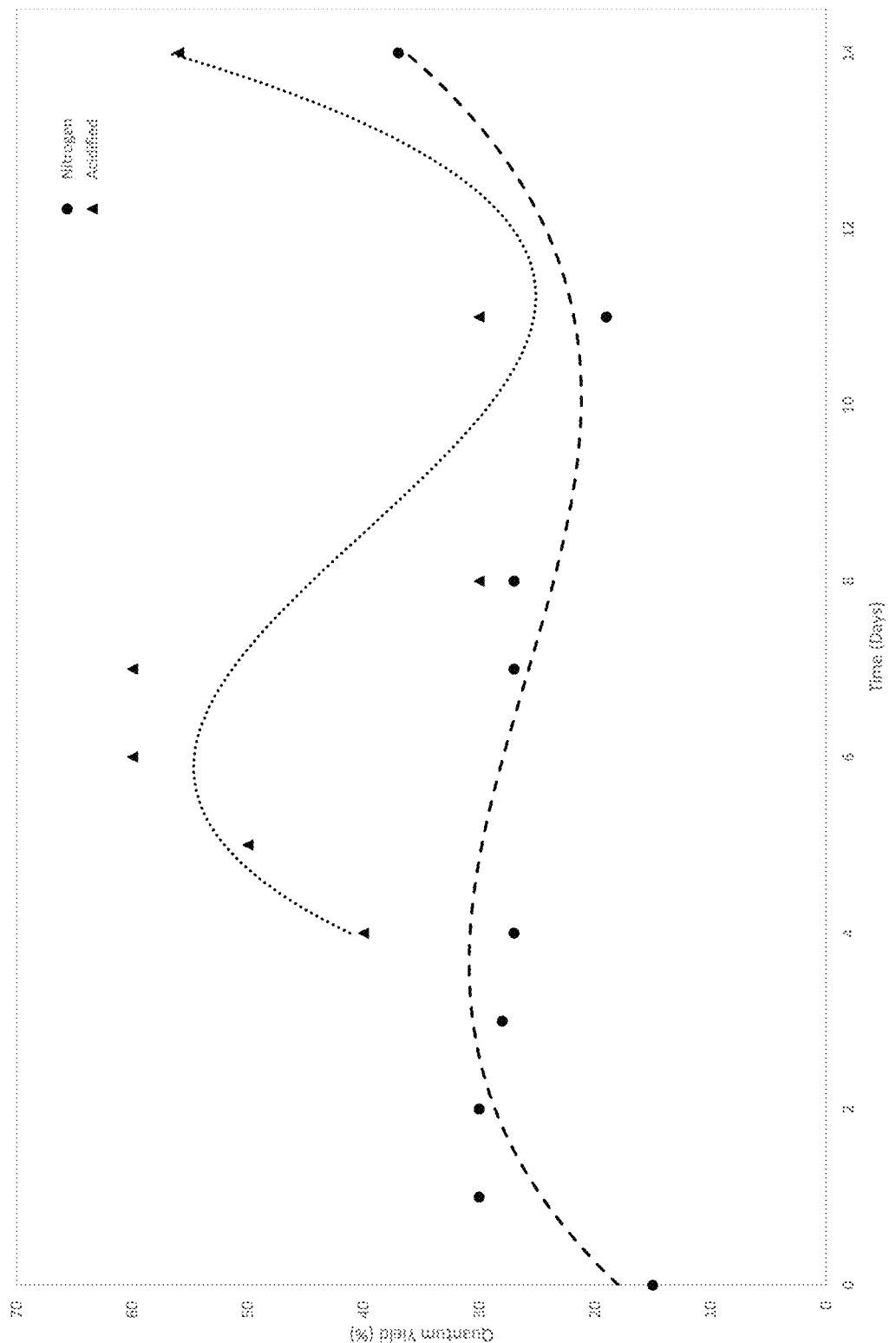
FIG. 9 is a scatter graph of the quantum yield (QY) of the fraction of material of Example 1 extracted in water versus time when stored under $N_2$ (circles), and with acidification (triangles).

Surprisingly, the QY of the fraction of material extracted in water was found to increase over time when stored under $N_2$, as shown in FIG. 9 (circles).

Effect of Acidification

A portion of the water-soluble fraction was acidified to a pH of 2-3 using concentrated HCl. The sample was flushed with $N_2$ and stored inerted in a crimp vial. Surprisingly, the QY of the material was found to increase with acidification and time, as shown in FIG. 9 (triangles).

Figure 10:
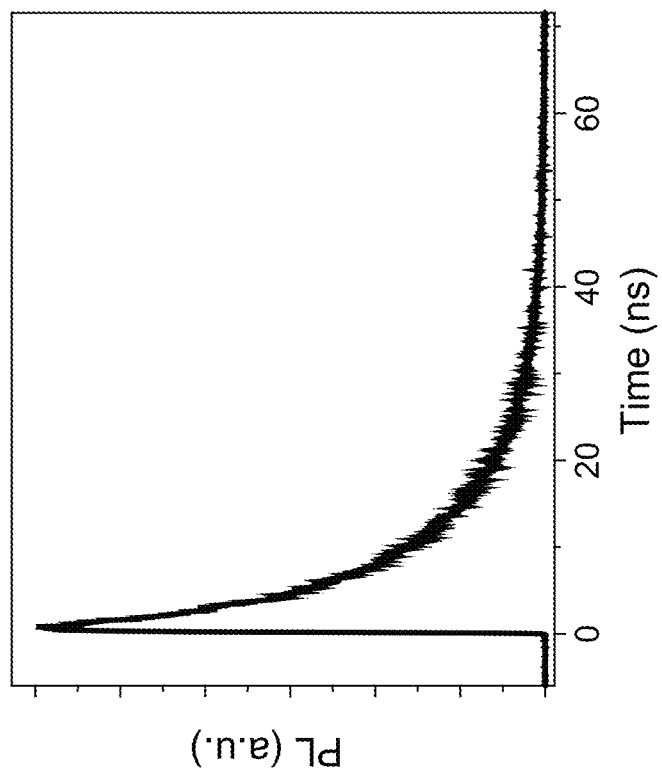
FIG. 10 is a single exponential fit of the time-resolved PL spectrum of acid-treated nanosheets, used to measure the PL lifetime.

The PL lifetime of the acidified material was measured using time-resolved photoluminescence. Using a single exponential fit (FIG. 10), the PL lifetime was measured at 9.8 ns. This is very close to the highest PL lifetime for chemically treated $MoS_2$ reported in the literature (10.8 ns) [M. Amani, D.-H. Lien, D. Kiriya, J. Xiao, A. Azcatl, J. Noh, S. R. Medhvapathy, R. Addou, S. KC, M. Dubey, K. Cho, R. M. Wallace, S.-C. Lee, J. H. He, J. W. Ager III, X. Zhang, E. Yabonovitch and A. Javey, Science, 2015, 350, 1065] and several orders of magnitude longer than that of as-exfoliated $MoS_2$, which is typically on the order of 100 ps.

The UV-vis absorption profile of the acid-treated nanosheets was also more defined and slightly red-shifted compared to that of the as-extracted nanosheets, as shown in FIG. 11.

Example 2: Template-Assisted Growth of $MoSe_2$ Nanosheets on ZnO Templates

ZnO Template Synthesis

ZnO templates were prepared according to Example 1.

Ligand Exchange 1 g hexadecylamine, 10 mL hexadecane and all of the ZnO cores (in toluene) were added to a round-bottomed flask and degassed at 80° C. for 1 hr. The reaction was left at 110° C., under nitrogen, overnight to enable ligand exchange. The next day the reaction was degassed for a further 1 hr at 80° C.

Substrate-Bound $MoSe_2$ Synthesis

In a vial, 2 g hexadecylamine and 10 ml hexadecane were mixed and degassed at 80° C. for 1 hr. In a glovebox, a vial was loaded with 0.132 g Mo(CO)$_6$ then capped with a SUBA-SEAL® rubber septum and removed from the glovebox. The hexadecylamine/hexadecane mixture was added to the Mo(CO)$_6$ vial, under nitrogen. The Mo(CO)$_6$/hexadecylamine/hexadecane mixture was warmed to about 150° C., under nitrogen. The ligand-exchanged ZnO cores were heated to 250° C., under nitrogen, and 1 mL portions of the molybdenum precursor were added every 5 minutes until the complete solution had been added. Then, 2 g diphenyl diselenide dissolved in 5 mL toluene were added over 90 minutes, via a syringe pump, and left for 50 minutes at 250° C. when complete. The reaction was cooled to 60° C., then 80 mL acetone were added and centrifuged. The solid was washed with acetone and centrifuged, twice. The brown precipitate was dispersed in 25 mL hexane.

Intercalation and Exfoliation

The process was carried out under anaerobic conditions. The solution of substrate-bound MoSe$_2$ in hexane was added to a nitrogen-filled flask containing 2 mL hexylamine and 10 mL propylamine. The mixture was stirred for 3 days. The reaction solution was evaporated under vacuum for 20 minutes, leaving a brown oil. 200 mL of degassed acetonitrile were added, then stirred for 3 days. The solution was filtered under nitrogen using a cannula filter, before evacuating under vacuum. The evacuated oil was redispersed in 6 mL acetonitrile, then stored in air for 6 days.

Solvent Polarity Purification

The acetonitrile supernatant was decanted, then water was added to the solids, followed by sonication for 5 minutes.

Example 3: Template-Assisted Growth of WS$_2$ Nanosheets on ZnO Templates

ZnO Template Synthesis
ZnO templates were prepared according to Example 1.
Ligand Exchange
Ligand exchange was carried out according to Example 2.
Substrate-Bound WS$_2$ Synthesis In a vial, 2 g hexadecylamine and 10 ml hexadecane were mixed and degassed at 80° C. for 1 hr. In a glovebox, a vial was loaded with 0.176 g W(CO)$_6$ then capped with a SUBA-SEAL® rubber septum and removed from the glovebox. The hexadecylamine/hexadecane mixture was added to the W(CO)$_6$ vial, under nitrogen. The W(CO)$_6$/hexadecylamine/hexadecane mixture was warmed to about 150° C., under nitrogen, resulting in a pale yellow solution. The ligand-exchanged ZnO cores were heated to 250° C., under nitrogen, while stirring, and 0.5 mL portions of the tungsten precursor were added every 5 minutes for 45 minutes (10 injections). 0.75 mL 1-dodecanthiol was added over 40 minutes using a syringe pump, then left for 90 minutes at 250° C. Three 2-mL portions of the tungsten precursor were then added at 5 minute intervals. 0.75 mL 1-dodecanethiol was added over 5 minutes using a syringe pump, then left at 250° C. for 45 minutes. The reaction was cooled to 60° C., then 80 mL acetone were added, followed by centrifugation. The solids were collected and re-dissolved in 25 mL hexane (bubbled with nitrogen).

Intercalation and Exfoliation

The solution of substrate-bound WS$_2$ in hexane was added to a nitrogen-filled flask containing 2 mL hexylamine and 10 mL propylamine. The mixture was stirred for 3 days. The reaction solution was evaporated under vacuum for 20 minutes, leaving a brown oil. 200 mL of degassed acetonitrile were added, then stirred for 3 days. The solution was decanted and filtered through a 0.45 μm syringe filter, before removing the solvent via rotary evaporation. 6 mL acetonitrile were added, then the solution was transferred to a vial and left in air for 7 days.

Solvent Polarity Purification

The solution in acetonitrile was dried back to an oil using a rotary evaporator. 30 mL water were added, then the sample was sonicated for 5 minutes. The solution was filtered through a 0.45 μm syringe filter. The resulting colourless solution was degassed and retained as the water-soluble phase (PL$_{max}$=431 nm; QY=15.7%). 15 mL acetonitrile was swirled in the rotary evaporator flask and passed through a syringe filter. The resulting orange solution was retained as the acetonitrile-soluble phase (PL$_{max}$=435 nm; QY=6.7%). 15 mL toluene were swirled in the rotary evaporator flask and passed through a syringe filter. The pale yellow solution was retained as the toluene-soluble phase (PL$_{max}$=427 nm; QY=2.3%).

Advantages of the above-described method include:

The method is scalable.

The material produced has a high QY compared to 2D nanosheets produced by the methods of the prior art, which suggests a material having fewer defects and a higher degree of crystallinity.

By controlling parameters including the template dimensions and size distribution, a narrow sheet size distribution may be achieved.

Non-exfoliated material may be reused, resulting in a high reaction yield, thus avoiding material waste.

The method provides a simple means colloidal 2D monolayer formation without chemical cutting or mechanical exfoliation. Narrower PL emission becomes possible without the extensive size selection operations that may be required for 2D monolayers made by other means. The nanoparticles may be made to be soluble in a range of different solvents.

The foregoing presents particular embodiments of a system embodying the principles of the invention. Those skilled in the art will be able to devise alternatives and variations which, even if not explicitly disclosed herein, embody those principles and are thus within the scope of the invention. Although particular embodiments of the present invention have been shown and described, they are not intended to limit what this patent covers. One skilled in the art will understand that various changes and modifications may be made without departing from the scope of the present invention as literally and equivalently covered by the following claims.

What is claimed is:

1. A composition of matter comprising:
    a nanoparticle template comprising a material having a first crystal structure; and
    a two-dimensional (2D) transition metal dichalcogenide nanosheet at least partially covering a surface of the nanoparticle template, the two-dimensional (2D) transition metal dichalcogenide nanosheet comprising a material having a second crystal structure,
    wherein the first crystal structure and the second crystal structure exhibit therebetween a lattice mismatch of around 5% or less.

2. The composition recited in claim 1, wherein the lattice mismatch between the first crystal structure and the second crystal structure is around 3% or less.

3. The composition recited in claim 1, wherein the first crystal structure is hexagonal.

4. The composition recited in claim 1, wherein the nanoparticle template is a nanopyramid.

5. The composition recited in claim 1, wherein the nanoparticle template is a quantum dot.

6. The composition recited in claim 1, wherein the nanoparticle template is a ZnO nanoparticle.

7. The composition recited in claim 1, wherein the material of the two-dimensional (2D) transition metal dichalcogenide nanosheet is $MoS_2$, $MoSe_2$ or $WS_2$.

8. The composition recited in claim 1, wherein the two-dimensional (2D) transition metal dichalcogenide nanosheet is a two-dimensional (2D) transition metal dichalcogenide quantum dot.

9. The composition recited in claim 1, wherein the nanoparticle template is a metal nanoparticle or a polymer nanoparticle.

10. A composition of matter comprising:
a nanoparticle template, the nanoparticle template being a nanopyramid; and
a two-dimensional (2D) transition metal dichalcogenide nanosheet at least partially covering a surface of the nanoparticle template.

11. The composition recited in claim 10, wherein:
the nanoparticle template comprises a material having a first crystal structure;
the two-dimensional (2D) transition metal dichalcogenide nanosheet comprises a material having a second crystal structure; and
the first crystal structure and the second crystal structure exhibit therebetween a lattice mismatch of around 5% or less.

12. The composition recited in claim 11, wherein the lattice mismatch between the first crystal structure and the second crystal structure is around 3% or less.

13. The composition recited in claim 11, wherein the first crystal structure is hexagonal.

14. The composition recited in claim 10, wherein the nanoparticle template is a quantum dot.

15. The composition recited in claim 10, wherein the nanoparticle template is a ZnO nanoparticle.

16. The composition recited in claim 10, wherein the two-dimensional (2D) transition metal dichalcogenide nanosheet comprises $MoS_2$, $MoSe_2$ or $WS_2$.

17. The composition recited in claim 10, wherein the two-dimensional (2D) transition metal dichalcogenide nanosheet is a two-dimensional (2D) transition metal dichalcogenide quantum dot.

18. The composition recited in claim 10, wherein the nanoparticle template is a metal nanoparticle or a polymer nanoparticle.

* * * * *